US009842954B1

(12) United States Patent
Lorenz (10) Patent No.: US 9,842,954 B1
(45) Date of Patent: Dec. 12, 2017

(54) RADIATION COLLECTION APPARATUS WITH FLEXIBLE STATIONARY MIRROR

(71) Applicant: William Andrew Lorenz, Urbana, OH (US)

(72) Inventor: William Andrew Lorenz, Urbana, OH (US)

( * ) Notice: Subject to any disclaimer, the term of this patent is extended or adjusted under 35 U.S.C. 154(b) by 366 days.

(21) Appl. No.: 14/452,611

(22) Filed: Aug. 6, 2014

Related U.S. Application Data

(60) Provisional application No. 61/862,933, filed on Aug. 6, 2013.

(51) Int. Cl.
*F24J 2/38* (2014.01)
*H01L 31/0525* (2014.01)

(52) U.S. Cl.
CPC .......... *H01L 31/0525* (2013.01); *F24J 2/38* (2013.01)

(58) Field of Classification Search
CPC ........ F24J 2/14; F24J 2002/5458; F24J 2/145; F24J 2002/108
USPC ................................. 126/684, 600
See application file for complete search history.

(56) References Cited

U.S. PATENT DOCUMENTS

| 3,868,823 | A | * | 3/1975 | Russell, Jr. | ............... | F24J 2/10 126/600 |
| 3,994,435 | A | * | 11/1976 | Barr | ...................... | F24J 2/045 126/573 |
| 4,056,309 | A | * | 11/1977 | Harbison | ............ | G02B 26/0825 126/570 |
| 4,071,017 | A | | 1/1978 | Russell, Jr. et al. | | |
| 4,078,549 | A | * | 3/1978 | McKeen | .................... | F24J 2/14 126/606 |
| 4,318,394 | A | * | 3/1982 | Alexander | ............ | F24J 2/1052 126/575 |
| 4,552,438 | A | * | 11/1985 | Murphy | ................ | F24J 2/1052 343/914 |
| 4,608,964 | A | * | 9/1986 | Russo | ...................... | F24J 2/125 126/624 |
| 4,719,903 | A | * | 1/1988 | Powell | ..................... | F24J 2/145 126/680 |
| 5,325,844 | A | * | 7/1994 | Rogers | ....................... | F24J 2/10 126/600 |
| 5,997,146 | A | * | 12/1999 | Denham | ............ | G02B 26/0825 359/846 |
| 6,363,928 | B1 | * | 4/2002 | Anderson, Jr. | ............ | F24J 2/14 126/573 |
| 6,994,082 | B2 | * | 2/2006 | Hochberg | ................ | F24J 2/145 126/694 |

(Continued)

*Primary Examiner* — Avinash Savani
*Assistant Examiner* — Deepak Deean
(74) *Attorney, Agent, or Firm* — Mark A. Navarre (57) ABSTRACT

A stationary radiation focusing device focuses incident radiation onto a movable radiation receiving element. The radiation focusing device is a curved mirror optimally configured to concentrate the reflected solar energy in a circle of focus aligned with the central axis of the mirror. The radiation receiving element constrained to follow a circle of focus associated with a given point(s) on the mirror's surface. A mirror support structure holds fixed the surface of the mirror in a region about the given point(s), and an adjustment mechanism coupled to the mirror at locations removed from the given point(s) flexes the other regions of the mirror in a manner to compensate for focusing error so that solar radiation incident on such other regions is more nearly focused on the radiation receiving element.

17 Claims, 10 Drawing Sheets

(56) References Cited

U.S. PATENT DOCUMENTS

| | | | | |
|---|---|---|---|---|
| 8,596,802 | B2* | 12/2013 | Gandhi | F24J 2/125 |
| | | | | 359/846 |
| 8,887,712 | B2* | 11/2014 | von Behrens | F24J 2/14 |
| | | | | 126/621 |
| 9,103,566 | B2* | 8/2015 | Kosaka | F24J 2/1047 |
| 9,322,574 | B2* | 4/2016 | von Behrens | |
| 2009/0223510 | A1* | 9/2009 | Larsen | F22B 1/006 |
| | | | | 126/694 |
| 2011/0088684 | A1* | 4/2011 | Tuli | F24J 2/18 |
| | | | | 126/573 |
| 2011/0094502 | A1* | 4/2011 | Reynolds | F24J 2/14 |
| | | | | 126/684 |
| 2011/0168160 | A1 | 7/2011 | Martinez Moll et al. | |
| 2011/0203574 | A1* | 8/2011 | Harding | F24J 2/055 |
| | | | | 126/595 |
| 2012/0186579 | A1* | 7/2012 | Dopp | F24J 2/145 |
| | | | | 126/684 |
| 2012/0285440 | A1* | 11/2012 | Kosaka | F24J 2/1047 |
| | | | | 126/600 |
| 2015/0128929 | A1* | 5/2015 | Saucedo | F24J 2/38 |
| | | | | 126/601 |
| 2015/0323224 | A1* | 11/2015 | Choori | F24J 2/541 |
| | | | | 126/605 |

\* cited by examiner

RADIATION COLLECTION APPARATUS WITH FLEXIBLE STATIONARY MIRROR

RELATED APPLICATIONS

This application claims priority based upon the Provisional Patent Application No. 61/862,993, filed Aug. 7, 2013.

TECHNICAL FIELD

The present invention relates to a radiation collection apparatus including a stationary but flexible mirror for optimally concentrating solar radiation on a movable radiation absorption element.

BACKGROUND OF THE INVENTION

A well-known way of capturing and converting solar radiation into a more useful form of energy such as electricity is to use a radiation focusing device (typically in the form of one or more mirrors) to concentrate and focus incident solar radiation on a radiation absorption element (typically a vessel containing a working fluid or an array of photovoltaic cells). As the angle of incidence of the solar radiation changes throughout the course of a day, the relative positions of the radiation focusing device and the absorption element are adjusted to keep the concentrated solar radiation focused on the radiation absorption element. Intuitively, the most practical and cost-effective mechanizations pair a fixed radiation focusing device with an absorption element that moves with respect to the radiation reflector. Representative examples of this approach are disclosed, for example, in the U.S. Pat. Nos. 3,868,823 and 4,071,017 to Russell, Jr. et al., the U.S. Pat. No. 3,994,435 to Barr, the U.S. Pat. No. 4,318,394 to Alexander, and the U.S. Patent Publication No. 2011/0168160 to Martinez Moll et al.

The radiation focusing device may comprise a series of flat mirrors, as disclosed by Russell Jr. et al., but more commonly comprises one or more curved (parabolic, spherical or cylindrical) mirrors, as disclosed by Barr, Alexander, and Martinez Moll et al. As disclosed in each of the foregoing references, the mirrors can be configured as a linearly extending trough so that the reflected solar radiation is focused above the mirrors on a linearly extending line or region that moves in a circular/cylindrical path as the angle of incidence of the solar radiation changes. Such a configuration is particularly advantageous in terms of mechanical simplicity because the radiation absorption element can simply be pivoted about a fixed point aligned with the center of the circular/cylindrical path of focus. But in practice, the disclosed reflector configurations allow significant divergence of the reflected solar energy as the solar angle of incidence strays from an optimal angle. As a result, the energy focused on the radiation absorption element is less concentrated, resulting in less efficient energy conversion. Accordingly, many such systems include a provision for adjusting the curvature of the radiation focusing device as a function of the solar angle of incidence to improve the concentration of solar energy focused on the radiation absorption element. See the aforementioned patent to Alexander, for example. And in mechanizations including a movable radiation reflector, see for example, the U.S. Pat. No. 4,056,309 to Harbison et al. and the U.S. Patent Publication No. 2012/0285440 to Kosaka et al.

SUMMARY OF THE INVENTION

The present invention is directed to an improved solar radiation collection apparatus including a stationary radiation focusing device and a movable radiation receiving element, where the radiation focusing device is a curved mirror optimally configured to concentrate the reflected solar energy in a linear circle of focus aligned with the central axis of the mirror.

Key to the invention is the recognition that solar energy (from any angle) incident on any given point of the mirror's surface is naturally focused onto a circle of focus that intersects the mirror at that point; and that points symmetrically disposed about the central axis of the mirror perfectly reflect onto the same circle of focus. If the radiation receiving element is constrained to follow the circle of focus associated with a given point(s), solar radiation incident on other regions of the mirror's surface will be less focused on the radiation receiving element. The various embodiments of this invention take advantage of this phenomenon in an apparatus that includes a radiation receiving element constrained to follow a circle of focus associated with a given point (or points) on the mirror's surface, a mirror support structure that holds fixed the surface of the mirror in a region about the given point(s), and an adjustment mechanism coupled to the mirror at locations removed from the given point(s) for flexing the other regions of the mirror in a manner to compensate for focusing error so that solar radiation incident on such other regions is more nearly focused on the radiation receiving element.

In one embodiment, the radiation receiving element is constrained to follow a circle of focus corresponding to the center of the mirror, which circle of focus is tangent to the surface of the mirror at its center. In this case, the mirror support structure holds fixed the center of the mirror, and the adjustment mechanism is coupled to the ends of the mirror for flexing the non-central portions of the mirror to compensate for focusing errors associated with solar energy incident on those portions of the mirror's surface.

In another embodiment, the radiation receiving element is constrained to follow a circle of focus corresponding to the ends of the mirror, which circle of focus intersects the ends of the mirror. In this case, the support structure holds fixed the ends of the mirror, the mirror is split at its center, and the adjustment mechanism is coupled to the inboard end of each mirror segment to compensate for focusing errors associated with solar energy incident on all but the ends of the mirror's surface.

In a further embodiment, the radiation receiving element is constrained to follow a circle of focus corresponding to a pair of points midway between the center and ends of the mirror, which circle of focus intersects the midpoints of the mirror. In this case, the support structure holds fixed the midpoints of the mirror, the mirror is split at its center, and the adjustment mechanism is coupled both the ends of the mirror and to the inboard end of each mirror segment to compensate for focusing errors associated with solar energy incident on all but the midpoints of the mirror's surface.

Due to the intrinsically optimal nature of these configurations, the reflected solar energy remains more concentrated with off-center angles of solar incidence, so that less corrective adjustment of the mirror curvature is needed. In variations on these embodiments, the radiation receiving element may be a secondary mirror that re-focuses and concentrates the reflected solar radiation on an absorption element.

DESCRIPTION OF THE PREFERRED EMBODIMENT

The solar radiation collection apparatus of the present invention is described in the context of a solar energy conversion apparatus in which solar radiation reflected from a stationary radiation focusing device (mirror) is focused on a radiation receiving element. In the illustrated embodiments, the absorption element is depicted as a tubular vessel through which is circulated the working fluid of a turbine-based electricity generator plant. Alternately, the absorption element could be implemented with an array of photovoltaic cells for converting the solar radiation into electricity directly. And in some applications, of course, the collected solar energy may be used for its heat without other energy conversion mechanisms. Hence the novelty of the present invention does not reside in the energy conversion aspect per se, but in the configuration and structure of the stationary radiation reflector element, and its coordinated control relative to the position of a movable radiation receiving element.

Figure 1:
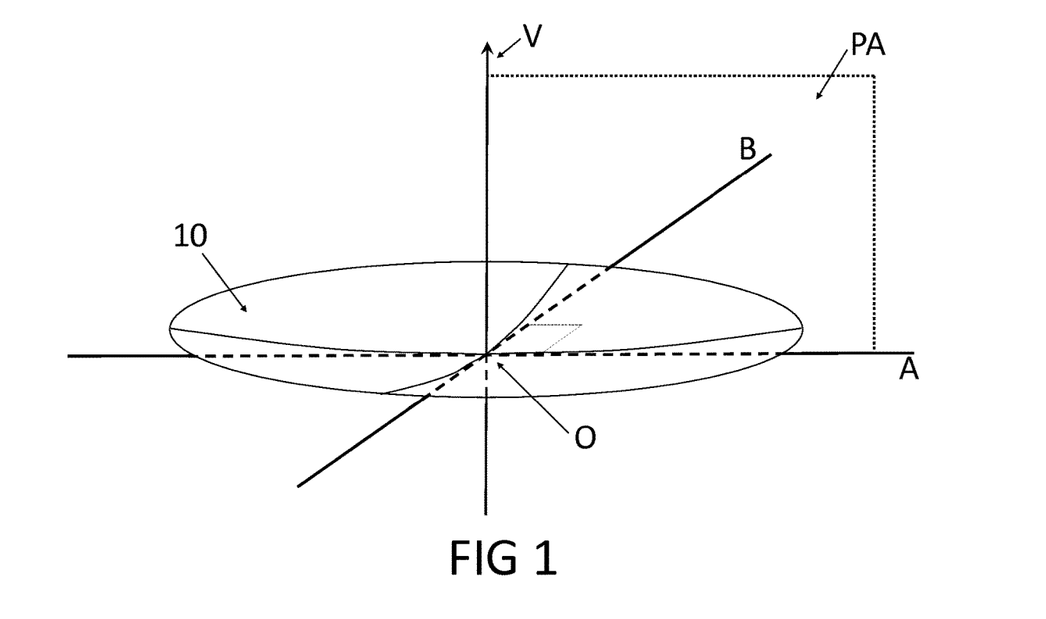
FIG. 1 is a diagram of a bowl-shaped mirror.

As illustrated in FIGS. 1, 2 and 2A-2C, the radiation focusing device is a slightly-curved mirror 10; it may be bowl-shaped (i.e., 3D) as illustrated in FIG. 1, or trough-shaped (i.e., 2D), as illustrated in FIGS. 2 and 2A-2C. At the center of a bowl-shaped mirror 10, designated in FIG. 1 by the point O, the curvature or bend of the mirror can be decomposed into two orthogonal perpendicular axes A and B. Each of the axes A and B is contained in a corresponding plane perpendicular to the mirror 10 at point O; for example, PA designates a plane containing the axis A. The trough-shaped mirrors of FIGS. 2 and 2A-2C are represented by the mirror section lying in plane PA.

Figure 2:
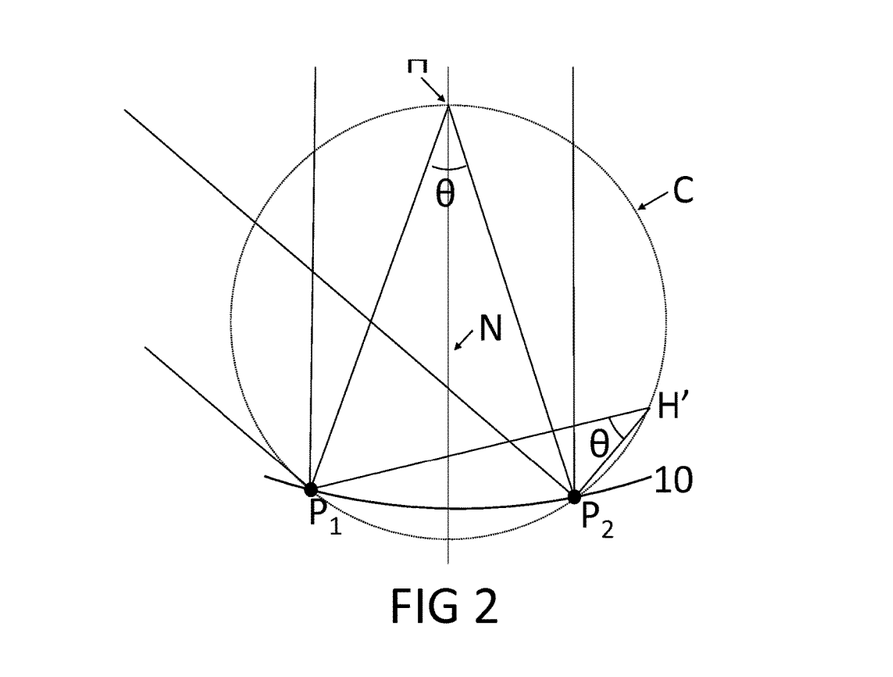
FIGS. 2, 2A and 2B are diagrams of a trough-shaped mirror.
Figure 2A:
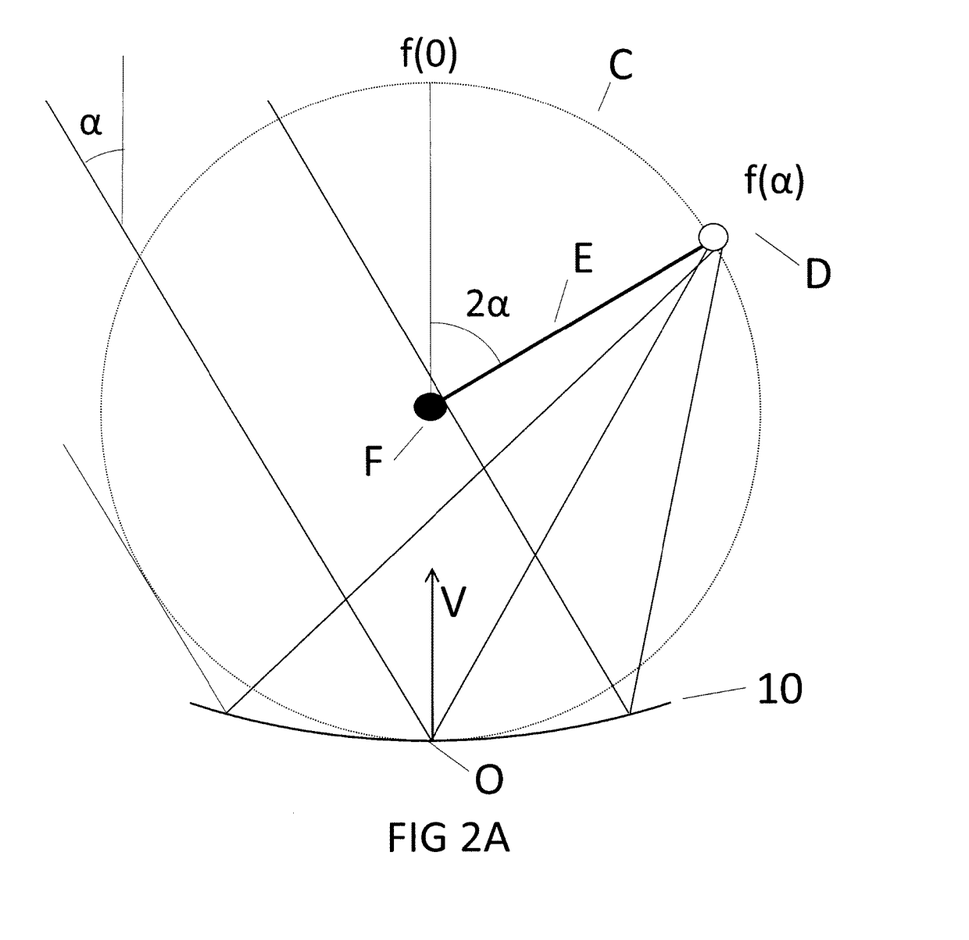

Referring to FIG. 2A, when the solar radiation incident on the center O of the mirror 10 has an angle of incidence a with respect to the normal vector V, and the reflected radiation will intrinsically focus at a point $f(\alpha)$ on the plane PA. Since the curvature of the mirror is slight, the function $f$ draws out a circle C in the plane PA as the incidence angle $\alpha$ varies. The circle of focus C has radius about one-quarter that of radius of curvature of the mirror 10; accordingly, its center F is located about one-quarter radius of curvature from the mirror 10. Since the mirror 10 of FIG. 2 is trough-shaped, the reflected radiation will be focused on a line perpendicular to the plane PA and passing through the point $f(\alpha)$, and the radiation absorption element D can be in the shape of a linearly extending bar or tube centered about the point $f(\alpha)$. Advantageously, the absorption element D can be mounted on a pivot arm E that is pivoted at the center F of the circular focus path C. As the incident angle of solar radiation changes, the pivot arm E is pivoted about point F so that the reflected radiation remains focused on the radiation absorption element D. For each incremental change $\alpha'$ of the solar incidence angle $\alpha$, the pivot arm E is rotated an angle of $2\alpha'$. A control system (not shown) pivots arm E about point F in response the sensed solar radiation angle of incidence, or in response to look-up table data as a function of time and date.

FIG. 2A also illustrates that solar radiation incident on other regions of the mirror's surface is not naturally focused on the same circle of focus C. In other words, there is one natural circle of focus for any given point on the mirror's surface, and since the absorption element D follows that circle of focus, solar radiation incident on other points of the mirror will focus less perfectly on the absorption element D. And because the objective is to focus all reflected solar energy on the absorption element D, the radiation reflected from such other points is considered to have a focusing error.

Figure 2B:
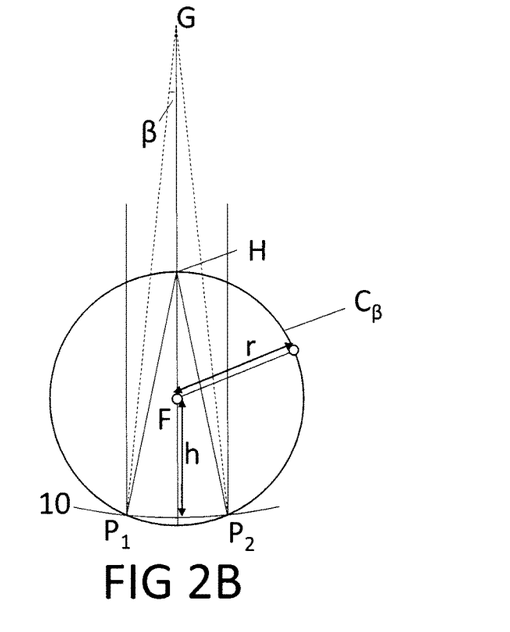

As mentioned above, the present invention springs from the recognition that solar energy incident on any given point of a slightly curved mirror is perfectly reflected onto a circle of focus that intersects the mirror at that point, and points equidistant from the center of the mirror 10 perfectly reflect onto the same circle of focus. In all cases, the circle of focus is centered about the mirror's central axis N—that is, an axis normal to the mirror 10 and passing through its center O. FIG. 2A depicts a circle of focus C for the center point O of the mirror 10; this circle of focus intersects the mirror 10 at point O, and hence, is tangent to the surface of mirror 10. FIGS. 2 and 2B depict a circle of focus C for the symmetrically displaced points $P_1$ and $P_2$; this circle of focus intersects the mirror 10 at points $P_1$ and $P_2$. These are but two examples, as there are different circles of focus for any given pair of symmetrically displaced points.

In general, the circle of focus for any given point on the mirror's surface may be defined in terms of the mirror's radius of curvature R and the arc angle $\beta$ of the point with respect to the center point O. This is graphically illustrated in FIG. 2B, where the depicted mirror 10 has a radius of curvature R, and point G represents the center of curvature of the mirror 10—that is, a point on the central axis N at a distance of R from the mirror's surface. The arc angle $\beta$ is the angle referenced to point G, subtending between the central axis N and a given point ($P_1$ or $P_2$ in the illustrated example) on the surface of the mirror. Of course, for the central point O, arc angle $\beta$ is zero. The circle of focus C may be characterized by its radius r and the height h of its center with respect to the mirror's center point O. The values of r and h are given in terms of radius R and arc angle $\beta$ as follows:

$$r = \frac{R}{4\cos\beta\cos2\beta}$$

$$h = R\left(1 - \frac{1}{2\cos\beta} - \frac{1}{4\cos\beta\cos2\beta}\right)$$

Figure 2C:
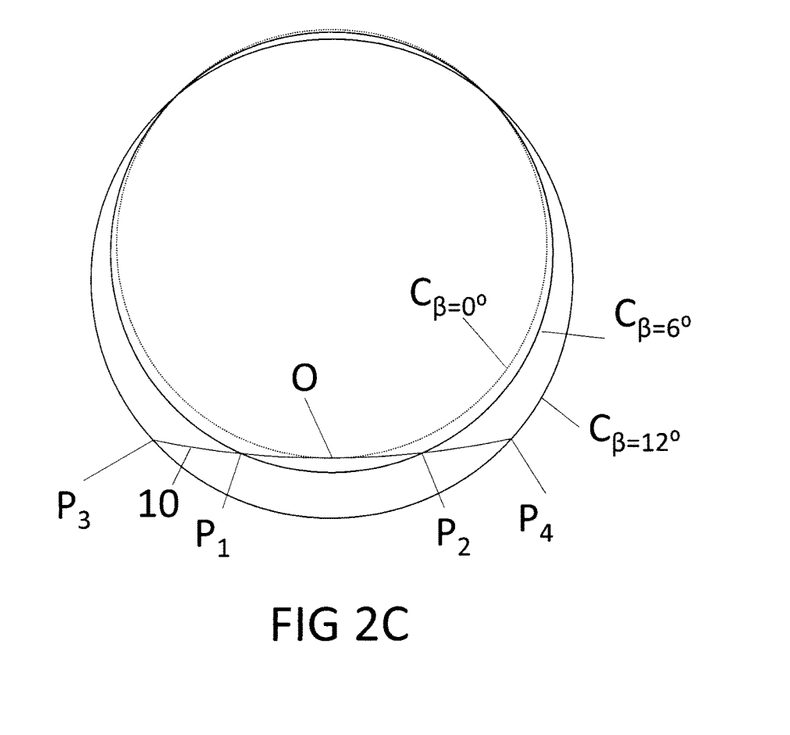
FIG. 2C is a diagram showing various circles of focus associated with different points on a trough shaped mirror.

FIG. 2C shows three different circles of focus C for a given radius of curvature R, and different values of arc angle β. If the mirror 10 has a total arc angle of 24°, the value of arc angle β for the end points of the mirror 10 will be 12°, the value of arc angle β for midpoints of the mirror 10 will be 6°, and of course, the arc angle β is zero for the center point O. Solar radiation incident on center point O will be perfectly focused on the circle of focus $C_{\beta=0}$; solar radiation incident on the midpoints $P_1$ and $P_2$ will be perfectly focused on the circle of focus $C_{\beta=6}$; and solar radiation incident on the mirror endpoints $P_3$ and $P_4$ will be perfectly focused on the circle of focus $C_{\beta=12}$. Among other things, FIG. 2C shows that the focusing error associated with solar radiation approximately normal to the mirror 10 is only slight because the various circles of focus nearly coincide, but that the focusing error increases dramatically as the angle of incidence increases beyond that point. And since an absorption element D can be constrained to follow but one circle of focus, it is particularly important to compensate for focusing errors when the solar radiation incidence angle is off-center. While it is generally knows to adjust the curvature of a mirror as a function of the solar angle of incidence to improve the concentration of solar energy focused on a radiation absorption element, the present invention provides an improved solar collection apparatus including a radiation receiving element constrained to follow a circle of focus corresponding to a specified point(s) on the mirror, a mirror support structure that holds fixed the surface of the mirror at the specified point(s), and an adjustment mechanism coupled to the mirror at locations removed from the given point for flexing the mirror in a manner to compensate for focusing error associated with solar energy incident on other points of the mirror's surface.

Figure 3:
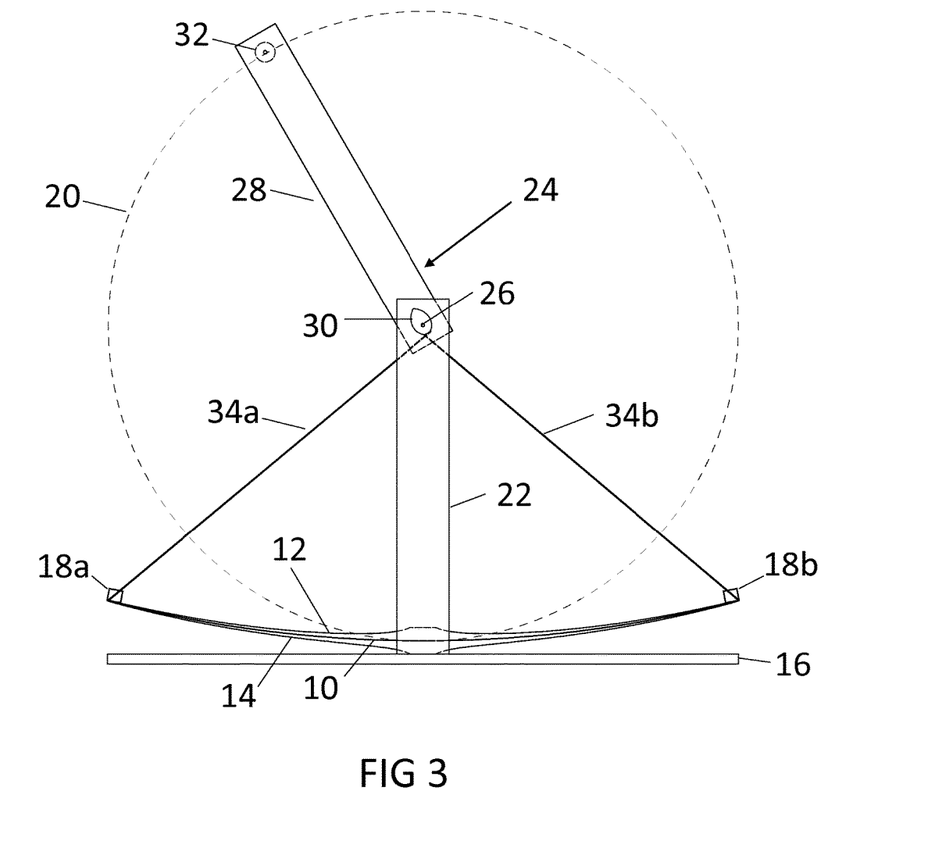
FIG. 3 is a representation of a solar radiation collection apparatus according to a first embodiment of this invention.

FIG. 3 depicts a first embodiment in which the radiation reflector is implemented with a single slightly bent trough-shaped mirror 10, and a radiation receiving absorption element 32 that allows a circular path of focus 20 corresponding to the center of mirror 10. The mirror 10 is supported by a mirror support structure including a base 16, sets of upper and lower crossbeams 12 and 14, and pair of support beams 18a, 18b. The lateral margins of mirror 10 are sandwiched between upper and lower crossbeams 12 and 14 extending parallel to the mirror's bent axis, and the longitudinal margins of mirror 10 are affixed to support beams 18a, 18b extending parallel to the mirror's flat axis. The crossbeams 12, 14 vary in thickness (profile) as shown, and their combined thickness varies with distance from the center of the mirror 10 to impart a variable stiffness to the mirror 10 along its bent axis, while the support beams 18 reduce drooping of the mirror surface along its flat axis. The bottom crossbeams 14 are fastened at their centers to the base 16, to thereby hold fixed the center of the mirror 10, while the crossbeams 12, 14 permit controlled flexure of the non-central regions of the mirror 10.

Solar radiation incident on the center of the mirror 10 will naturally reflect onto a circular focus path 20 tangent to the surface of mirror 10. The radiation absorption element 32 is constrained to follow the circular focus path 20 by a series of pivot arm assemblies 24 distributed along the flat axis of the mirror 10. The side view of FIG. 3 depicts one such pivot arm assembly 24; it includes a vertical support column 22 mounted on the base 16, a support shaft 26 rotatably mounted on the support column 22 at the center of the circular focus path 20, a pivot arm 28 mounted on the support shaft 26 for rotation therewith, and a cam element 30 also mounted on the support shaft 26 for rotation therewith. The length of the pivot arm 28 is such that it extends somewhat beyond the circular focus path 20, and the absorption element 32 is supported by the pivot arm 28 at the circular focus path 20.

As the direction of the incident radiation changes, the support shaft 26 is rotated as required to maintain the radiation absorption element 32 in alignment with the focus of the reflected radiation. The rotation of support shaft 26, and hence pivot arm 28, will be approximately twice the change in the mean direction of incident radiation, as indicated in the graphical representation of FIG. 2A. Rotation of the support shaft 26 can be achieved using a motor (not shown), in a manner given by common practice; this involves either preprogramming a fixed path using a computer and the knowledge of the radiation direction as a function of time, or using a feedback mechanism designed to maximize incident radiation on the radiation absorption element 32.

The cam element 30 and cables 34a, 34b are used to nonlinearly flex the mirror 10 as the support shaft 26 is rotated to move the radiation absorption element 32. The cam element 30 is rigidly mounted on support shaft 26 proximal to the support column 22, and the cables 34a, 34b are oppositely wrapped about the cam element 30, as depicted in FIG. 3. The loose (unwrapped) end of cable 34a is fastened to the longitudinal margin of mirror 10 adjacent the support beam 18a, and the loose (unwrapped) end of cable 34b is fastened to the longitudinal margin of mirror 10 adjacent the support beam 18b. When the support shaft 26 rotates to adjust the location of the radiation absorption element 32 on the circular focus path 20, the cables 34a and 34b respectively wrap and unwrap on the cam element 30, causing the mirror 10 to flex or bend about its bent axis. The amount of flexure of the mirror 10 is a function of the shape of the cam element 30, the profile of the crossbeams 12 and 14, and the degree of rotation of the support shaft 26.

The curvature at the center of the mirror 10 is perfect for focusing light along the circular focus path 20, as this is how the circular focus path 20 was defined. With increasing distance from the center of mirror 10, however, the surface of the mirror must be increasingly flexed in order to concentrate the reflected radiation on the radiation absorption element 32 as the solar incidence angle changes. And since the amount of mirror flexure depends upon the shape of the cam element 30, the profiles of the crossbeams 12, 14, and the degree of rotation of the central axle 26, the concentration of reflected radiation incident on the radiation absorption element 32 can be optimized by suitably shaping the profiles of the crossbeams 12, 14 and the cam element 30.

To model the effect of the crossbeams 12 and 14, it can be assumed that the cable 34a applies a force F to the longitudinal margin of the mirror 10, and that the mirror's curvature at a distance D from its center changes by a factor kD determined by the combined thickness T of crossbeams 12 and 14. This provides a linear correction, and matches the fact that no correction is needed at the center of mirror 10 (i.e., at D=0). To create such a linear correction, the crossbeams 12, 14 will have a combined thickness T(x) given by:

$$T(x)=K[(d_0-d)/d]^{1/3}$$

where K is any constant, d is the (positive) distance from the center of the mirror 10 along its bent axis, and $d_0$ is the distance from the center of the mirror 10 to the point where the force F is applied by the cable 34a. This thickness T(x) goes to zero at the edge of the mirror 10, and becomes very large for small values of d. In practice, near d=0, T(x) has a large enough value to negate any significant change in curvature at the center of the mirror 10. The thicknesses of the crossbeams 12, 14 are thus restricted. The original curvature of the crossbeams 12, 14, and thus the mirror 10, with no force applied to cables 34a, 34b can still be chosen, as can the shape of the cam element 30. This can be done by first restricting the crossbeam shape to require a mirror shape that focuses light perfectly (which will be the correct subsection of a parabola) at some specific solar incidence angle. Given this restriction, one can numerically fit the shape of the cam element 30, and thus the distance of cable pulled, as a function of solar incidence angle to minimize the overall error. The overall error can be defined as the maximum deviation of the mirror 10 from one that focuses perfectly for any allowed incidence angle.

Figure 4:
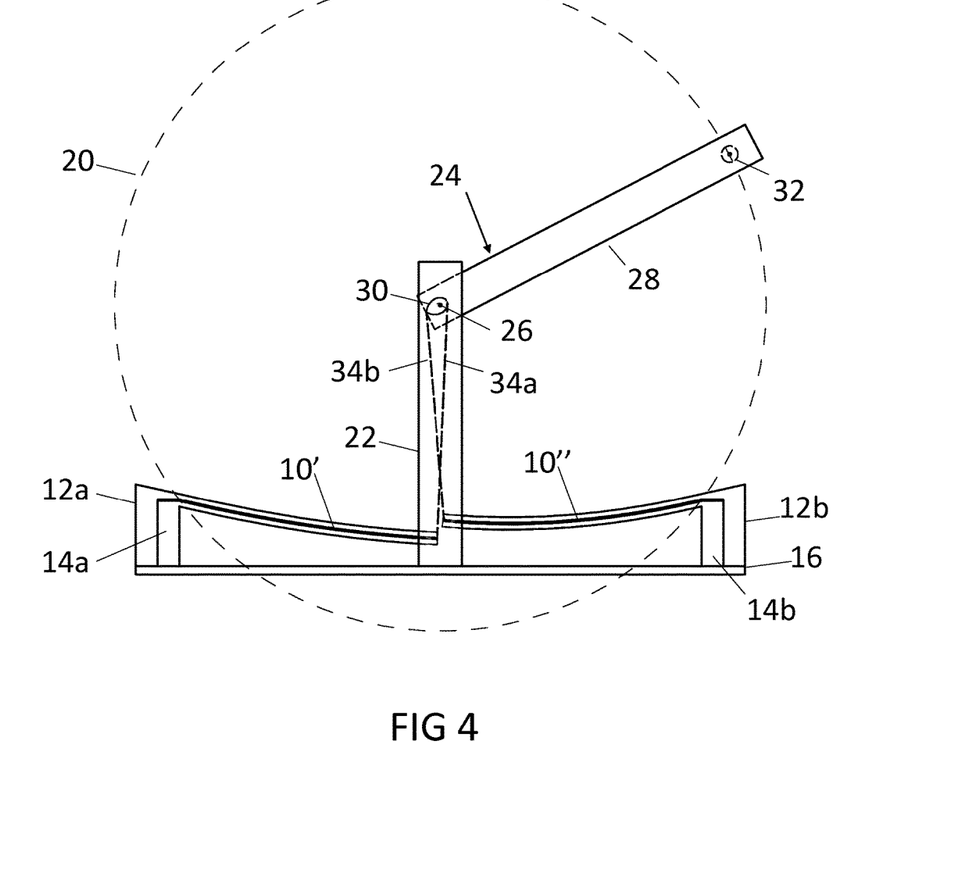
FIG. 4 is a diagrammatic representation of a solar radiation collection apparatus according to a second embodiment of this invention.
Figure 5:
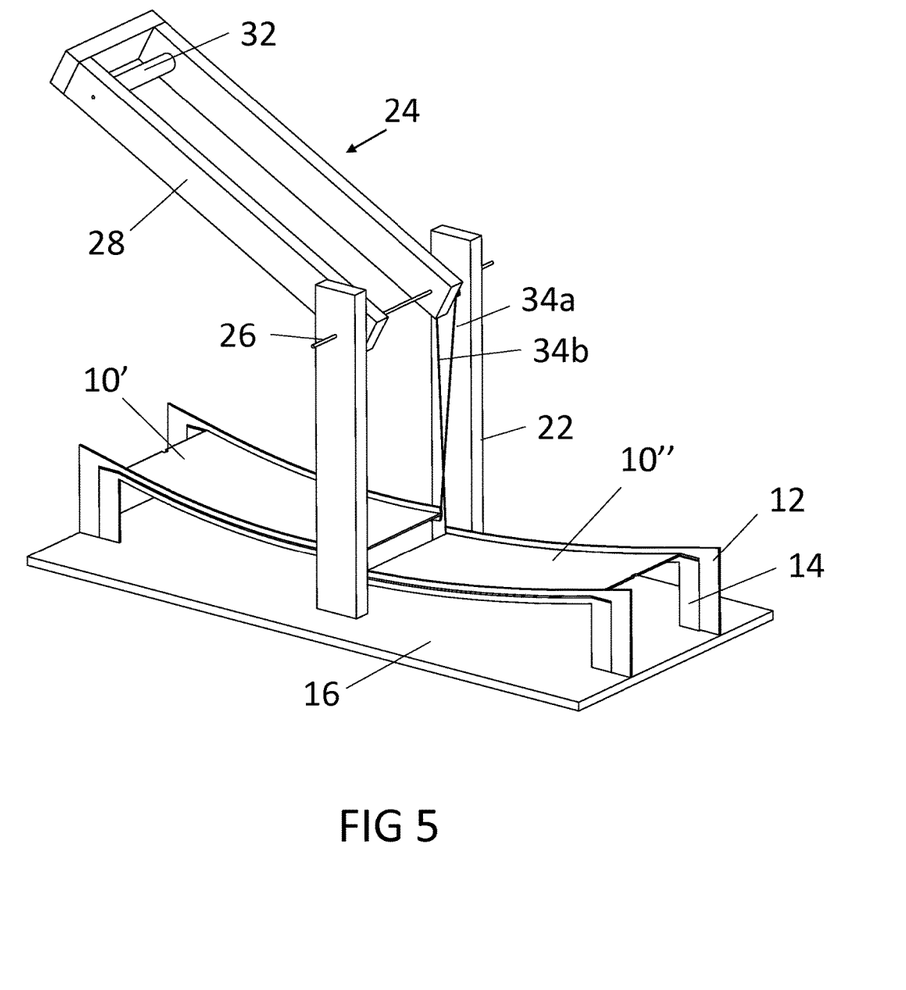
FIG. 5 is an isometric representation of the solar radiation collection apparatus of FIG. 4.

FIGS. 4-5 depict a second embodiment in which the radiation reflector is implemented with a split trough-shaped mirror 10, and the absorption element 32 follows a circular path of focus 20 corresponding to the endpoints of mirror 10. The endpoints of the mirror 10 are held fixed, and the mirror 10 is split in the middle to form two mirror segments 10' and 10" so that portions of the mirror away from the endpoints can be flexed to compensate for focusing errors. Each mirror segment 10', 10" is attached along its bent axis to upper and lower crossbeams 12 and 14. The bottom crossbeam 14 is connected to the base 16 near the outboard edge of each mirror 10', 10". As in the embodiment of FIG. 3, the absorption element 32 is supported by a series of pivot arm assemblies 24, each comprising a vertical support column 22 mounted on the base 16, a support shaft 26 rotatably mounted on the support column 22 at the center of the circular focus path 20, a pivot arm 28 mounted on the support shaft 26 for rotation therewith, and a cam element 30 also mounted on the support shaft 26 for rotation therewith.

In the embodiment of FIGS. 4-5, the cables 34a and 34b are attached to the center, or inboard, ends of the mirror segments 10', 10". The bending of the mirror segments 10', 10" is determined by the profile (and hence, the stiffness) of the crossbeams 12 and 14, the shape of the cam element 30, and the amount the pivot arm 28 rotates. The thickness/profile of the crossbeams 12 and 14 and the shape of the cam element 30 are chosen to optimize solar concentration on the radiation absorption element 32 as the angle of incident radiation varies through a chosen range. This optimization can be done as in the first embodiment. In this case, the optimal thickness of the crossbeams 12, 14 is constant, as illustrated in FIGS. 4-5.

Figure 6:
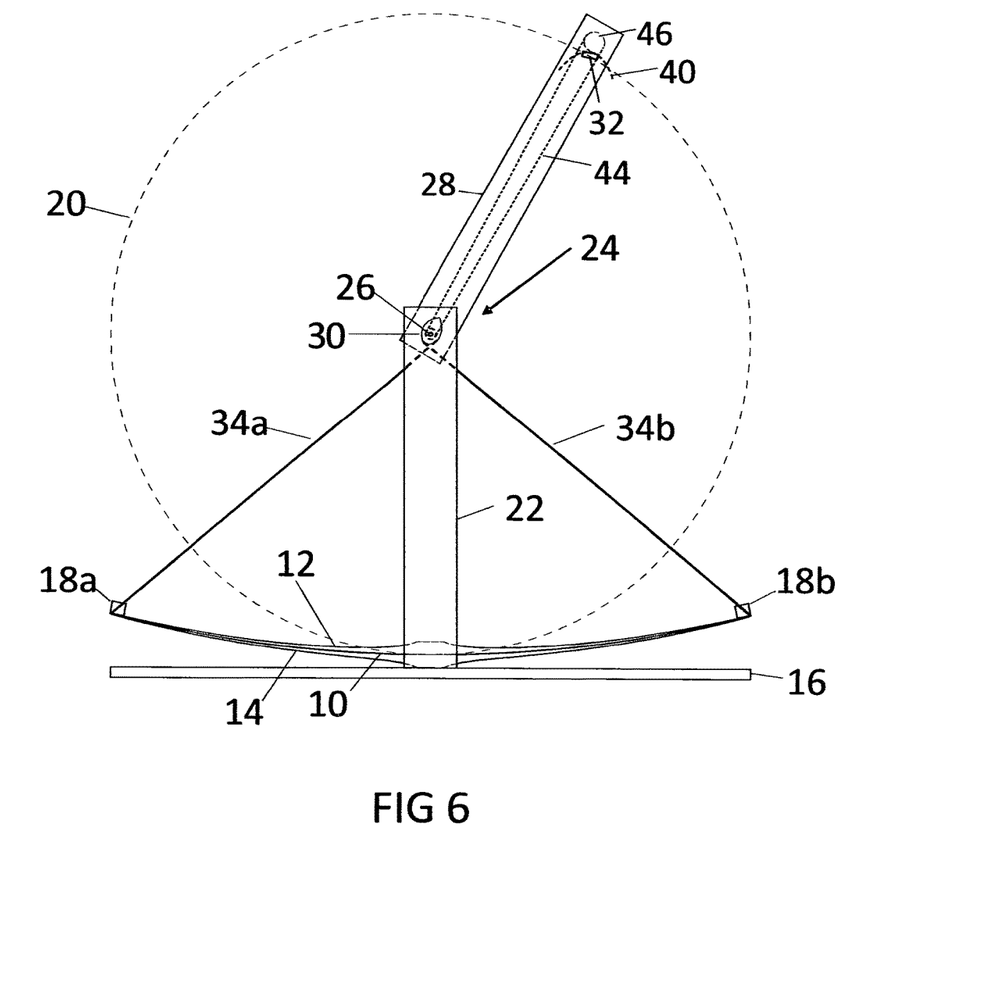
FIG. 6 is a representation of a solar radiation collection apparatus according to a third embodiment of this invention.

FIG. 6 depicts a third embodiment in which the radiation reflector is implemented with a single slightly bent trough-shaped mirror 10, as in the embodiment of FIG. 3. However, the third embodiment utilizes a trough-shaped secondary reflector 40. The mirror 10 is supported by crossbeams 12, 14 and a base 16, with the crossbeams 12, 14 being fastened to the base 16 at their midpoints. Each of the distributed pivot arm assemblies 24 includes a vertical support column 22 mounted on the base 16, a support shaft 26 rotatably mounted on the support column 22 at the center of the circular focus path 20, a pivot arm 28 mounted on the support shaft 26 for rotation therewith, and a cam element 30. The pivot arm 28 supports the radiation absorption element 32 at the circular path of focus 20 as before, and the trough-shaped secondary reflector 40 is rigidly supported on a secondary support shaft 46. The secondary support shaft 46 is rotatably mounted on pivot arm 28 near its outboard end, outboard of the radiation absorption element 32, and is coupled to the support shaft 26 by a cable or chain 44 so that rotation of the support shaft 26 produces corresponding rotation of the secondary support shaft 46, and hence, secondary reflector 40. But the radius of the secondary support shaft 46 is twice that of the support shaft 26 so that the secondary reflector 40 rotates only half as much as the pivot arm 28. This optimizes light incident on the secondary reflector 40 and radiation absorption element 32.

Bending of the mirror 10 is determined by the shape and variable profile of the crossbeams 12 14, the length of the cables 34a, 34b, and the rotary position of support shaft 26. These are optimized to maximize the radiation incident on the secondary reflector 40. The secondary reflector 40 is a compound parabolic mirror, and re-focuses the reflected radiation from mirror 10 onto the radiation absorption element 32.

Figure 7:
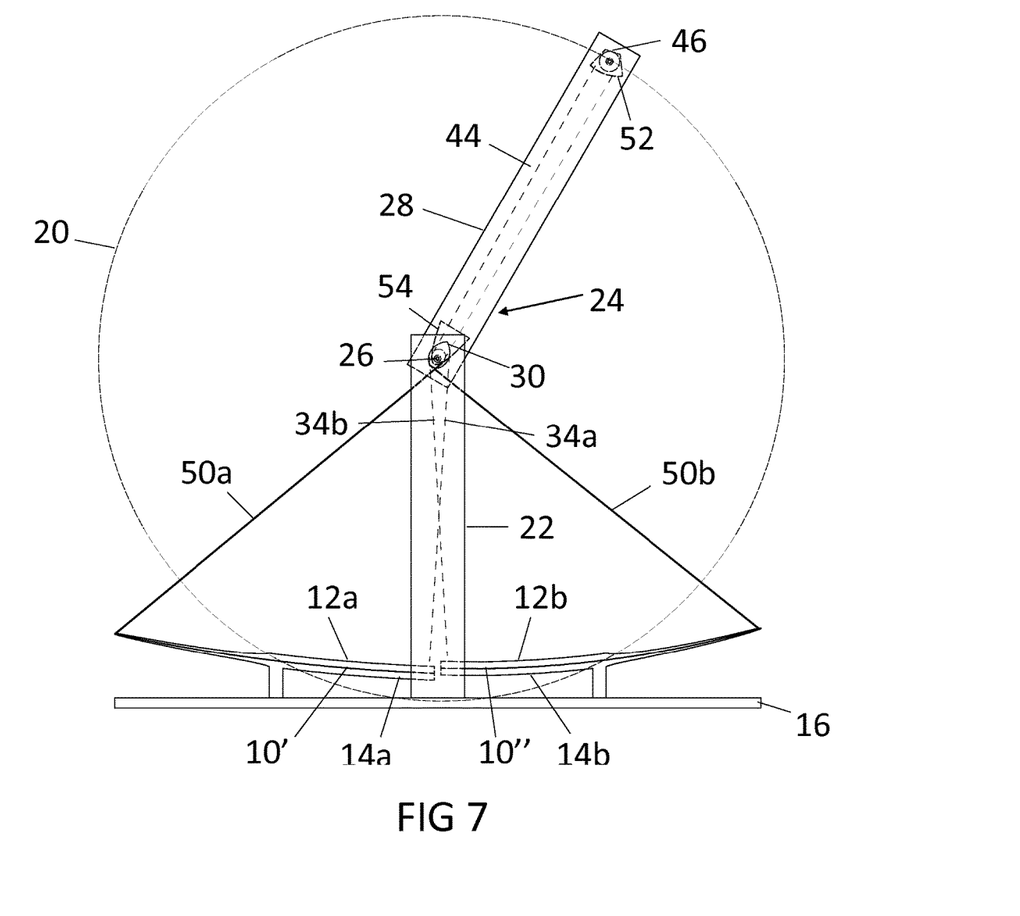
FIG. 7 is a representation of a solar radiation collection apparatus according to a fourth embodiment of this invention.

FIG. 7 depicts a fourth embodiment in which the radiation reflector is implemented with a split trough-shaped mirror as in the embodiment of FIGS. 4-5, and a radiation receiving element 52 constrained to follow a circular path of focus 20 corresponding to the midpoints of mirror 10. The midpoints of the mirror 10 are held fixed by the base 16, and the mirror 10 is split in the middle to form two mirror segments 10' and 10" so that portions of the mirror away from its midpoints can be flexed to compensate for focusing errors. In this case however, the adjustment cables are attached both to the endpoints of the mirror segments 10', 10" and to the inboard ends of the mirror segments 10' and 10". The radiation receiving element 52 is a re-focusing trough-type mirror that cooperates with a tertiary reflector 54 to permit the radiation absorption element to be fixed instead of movable. In this embodiment, the support shaft 26 is rigidly attached to the support column 22, and also serves as the radiation absorption element. Since the support shaft/absorption element 26 is fixed, the pivot arm 28 is rotatably mounted on the support shaft 26, and the electric drive motor (not shown) rotates the pivot arm 28 instead of the support shaft/absorption element 26. A pair of tapered crossbeams 12a, 12b and 14a, 14b sandwich lateral margins of the thin slightly bent mirror segments 10', 10" to impart a variable stiffness to the mirror segments 10', 10" along their bent axes, and each lower crossbeam 14a, 14b rigidly mounts to the base 16 approximately at its mid-point.

Bending of the mirror segments 10', 10" in relation to rotation of the pivot arm 28 is achieved with first and second pairs of cables 34a, 34b and 50a, 50b. The cables 34a, 34b are attached to the inboard ends of the mirror segments 10', 10" as in the embodiment of FIGS. 4-5, and are oppositely wrapped around a cam element 30 rigidly fastened to the inboard end of pivot arm 28. The cables 50a, 50b are fastened to the longitudinal margins of mirror segments 10', 10" in a manner analogous to the embodiment of FIG. 3, and oppositely wrapped around the cam element 30, or a secondary cam element also fastened to the inboard end of pivot arm 28.

A secondary support shaft 46 is rotatably mounted on the outboard end of the pivot arm 28 substantially at the circular path of focus 20, and the secondary reflector 52 is rigidly fastened to the secondary support shaft 46. A cable or chain 44 couples the support shaft/absorption element 26 to the secondary support shaft 46, so that when the motor rotates the pivot arm 28 with respect to the base 16, the secondary reflector 52 also rotates with respect to the base 16. But the radius of the secondary support shaft 46 is twice that of the support shaft/absorption element 26 so that the secondary reflector 52 rotates only half as much as the pivot arm 28. The secondary reflector 52 is a hyperbolic mirror, and re-focuses the radiation gathered from the mirror segments 10', 10" on the tertiary reflector 54, which is rigidly fastened to the inboard end of the pivot arm 28. The tertiary reflector 54 is a compound parabolic reflector, and re-focuses light the radiation gathered from the secondary reflector 52 on the support shaft/absorption element 26. The shape of the cam element(s) 30 and the crossbeams 12 and 14 are chosen to maximize the radiation incident on the support shaft/absorption element 26 for a given range of angles of mean incident radiation. This maximization can be done in a manner similar to that described in the other embodiments.

Figure 8:
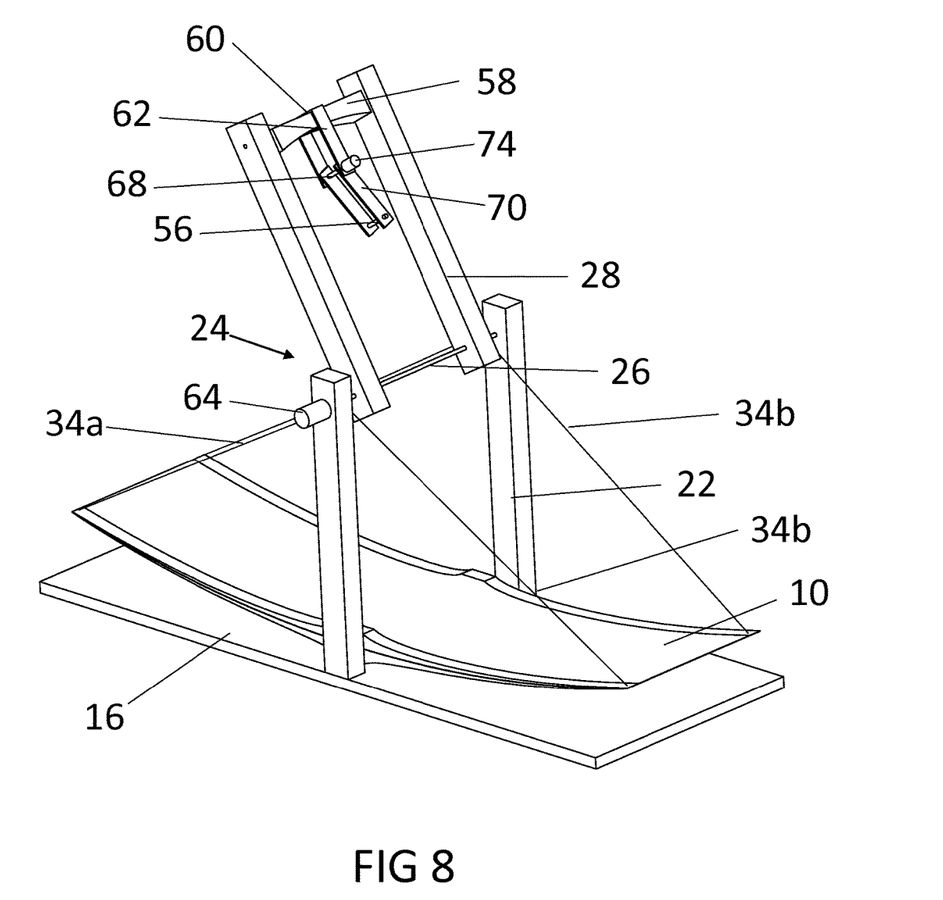
FIG. 8 is a representation of a solar radiation collection apparatus according to a fifth embodiment of this invention.

FIG. 8 depicts a fifth embodiment that features primary and secondary mirrors 10 and 58 to concentrate radiation along two different axes and achieve higher concentration of radiation on a smaller radiation absorption element 56. The first axis coincides with the bent axis of the primary mirror 10, and the second axis coincides with the bent axis of the secondary mirror 58. Incident radiation is concentrated along the first axis by the primary mirror 10, and then along the second axis by the secondary mirror 58.

The flat axis of primary mirror 10 is flanked by pair of pivot arm assemblies 24, each such pivot arm assembly 24 including a vertical support column 22 mounted on a base 16, a central support shaft 26 rotatably mounted on the vertical support column at its upper end, and a pivot arm 28 rigidly fastened to the support shaft 26 for rotation therewith. The secondary mirror 58 is fastened to the outboard ends of the pivot arms 28 to receive radiation reflected from the primary mirror 10, and a motor 64 mounted on one of the vertical support columns 22 rotates the support shaft 26 and thus the secondary mirror 58 with respect to the base 16 to keep the secondary mirror 58 as close as possible to the focus point of radiation reflected from the primary mirror 10.

A secondary mount 60 is provided at the midpoint of the secondary mirror 58 for supporting the radiation absorption element 56. A pair of secondary support arms 62 fastened to the secondary mounting plate 60 extend inward toward the support shaft 26, and rotatably support a secondary support shaft 68. The radiation absorption element 56 is supported between a pair of secondary pivot arms 70, which in turn, are rigidly fastened to the secondary support shaft 68 so that rotation of the secondary support shaft 68 with respect to secondary support arms 62 produces corresponding rotation of the radiation absorption element 56 with respect to the secondary mirror 58. A second electric motor 74 fastened to one of the secondary support arms 62 is provided to rotate the secondary support shaft 68, and hence the radiation absorption element 56, with respect to the secondary mirror 58.

As in the embodiments of FIGS. 3 and 7, a set of cables 34a, 34b at each pivot arm assembly 24 couple the longitudinal margins of the primary mirror 10 to the cam elements (not shown) on the support shaft 26 for flexing the primary mirror 10 in relation to rotation of the support shaft 26. In addition, the primary mirror 10 may be equipped with crossbeams as in previous embodiments.

The bending of primary mirror 10 is coupled to rotation of the support shaft 26, and hence secondary mirror 58, by the motor 64, which in turn is coordinated to match the incident radiation. As before, the speed that the support shaft 26 turns is twice the speed at which the direction of the incident radiation, projected to the first axis, moves. This required motion of the support shaft 26 is achieved in a manner given by common practice, as mentioned in previous embodiments.

For sufficiently focused radiation with mean angle within some predetermined range, the incident radiation should all or mostly fall on the secondary mirror 58. The secondary mirror 58 is curved in a similar manner, though normally at a different scale, to the primary mirror 10. In this embodiment, for ease of construction the secondary mirror 58 is rigidly mounted to the pivot arm assemblies 24, but the secondary mirror 58 could alternatively be adaptively bent in a manner similar to the primary mirror 10.

Figure 9:
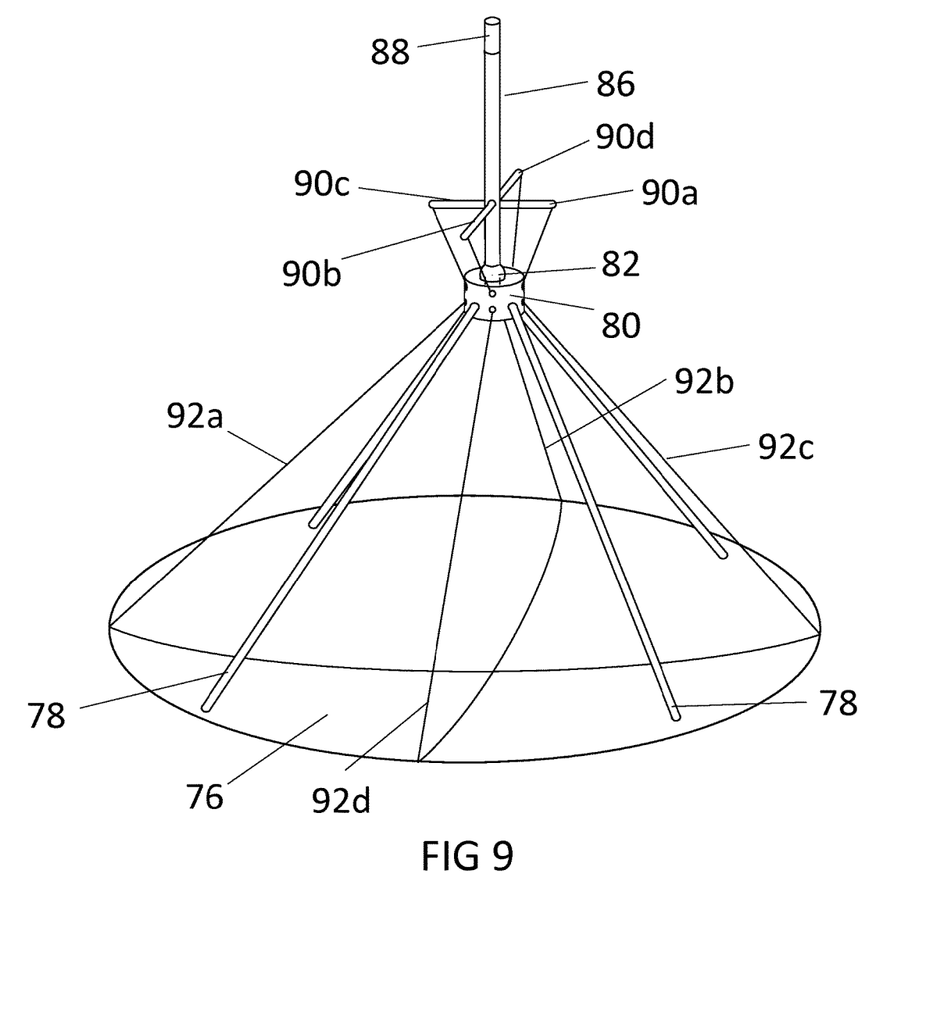
FIG. 9 is a representation of a solar radiation collection apparatus according to a sixth embodiment of this invention.

FIG. 9 depicts a sixth embodiment that features a non-linear concentrator design, where the slightly-curved mirror 76 is dish-shaped instead of trough-shaped. The reflected radiation along any given axis of the mirror 76 has a circular path of focus that includes the surface of (i.e., is tangent to) the mirror 76. The reflected radiation is concentrated where the various circular paths of focus coincide, and a radiation absorption element 88 is located at that point. The structure illustrated in FIG. 9 and described below provides a way of supporting the radiation absorption element 88, adjusting its position based on changes in the incident angle of solar radiation, and flexing the mirror 76 accordingly to concentrate the reflected radiation on the radiation absorption element 88 as the solar incidence angle varies from the ideal angle.

The radiation absorption element 88 is supported on the outboard end of a rod 86. The inboard end of rod 86 is supported by a hub 80, and the hub 80 is rigidly supported over the center of mirror 76 by a distributed array of support arms 78. The coupling between hub 80 and the inboard end of rod 86 is a ball-and-socket joint 82, and a two-axis motor controller (not shown) mounted on hub 80 controls the angular orientation of the rod 86 in relation to the incident angle of solar radiation to maintain the radiation absorption element 88 at the point of maximally concentrated reflected radiation; any conventional two-axis tracker can be used for this purpose.

Curvature adjustment of mirror 76 is achieved with a cable linkage coupling the rod 86 to the margins of the mirror 76. A set of four arms 90a, 90b, 90c, 90d fastened to the rod 86 extend perpendicular to the rod 86 at intervals of 90 degrees, and a set of four cables 92a, 92b, 92c, 92d passing through openings provided in the hub 80 couple the margin of the mirror 76 to the outboard ends of the arms 90a, 90b, 90c, 90d. The openings in the hub 80 and the points of cable attachment are aligned with the arms 90a, 90b, 90c, 90d so that movement of a given arm 90a, 90b, 90c or 90d produces a corresponding movement of the cable 92a, 92b, 92c, 92d fastened to the opposite side of the mirror 76. For example, if a given tilting of the rod 86 produces upward movement of the outboard end of arm 90a, the cable 92a attached to the opposite side of the mirror 76 is pulled upward to increase curvature in that quadrant of the mirror 76; of course, the opposite effect would simultaneously occur on the opposite side of the mirror 76. Thus, the cables 92a, 92b, 92c, 92d bend the mirror 76 based on the location of the cable attachment to the mirror 76, the support hub 80 and the cable attachment to an arm 90a, 90b, 90c, 90d, as well as the possibly variable rigidity of the mirror 76. These are all chosen to maximize the concentration of radiation on the radiation absorption element 88 for a given range of incident radiation angles.

While the present invention has been described with respect to the illustrated embodiment, it is recognized that numerous modifications and variations in addition to those mentioned herein will occur to those skilled in the art. Accordingly, it is intended that the invention not be limited to the disclosed embodiment, but that it have the full scope permitted by the language of the following claims.

The invention claimed is:
1. A radiation collection apparatus comprising:
a stationary slightly curved, flexible mirror having a fixed radius of curvature sufficiently slight that solar radia- tion incident on the mirror is reflected and focused on a circular path of focus that intersects the mirror on at least one point;

a mirror support structure contacting said mirror to hold said mirror fixed in a region about said at least one point, while allowing flexure of other regions of said mirror;

a radiation receiving element constrained to move relative to the mirror in said circular path of focus so that solar radiation incident on the mirror region held fixed by said mirror support structure is naturally reflected and focused on said radiation receiving element; and an adjustment mechanism including a rotary element disposed above said mirror at a center of said circular path of focus constrained to rotate in relation to the movement of said radiation receiving element, and at least two links oppositely coupling said rotary element to said mirror at first and second locations removed from said at least one point so as to oppositely flex the mirror at said first and second locations in relation to the rotation of said rotary element to compensate for focusing errors.

2. The radiation collection apparatus of claim 1, where said mirror support structure further comprises:

a support column extending above said mirror;

a support shaft rotatably mounted on said support column at the center of said circular path of focus; and a movable arm fastened to said support shaft for rotation therewith and supporting said radiation receiving element at said circular path of focus.

3. The radiation collection apparatus of claim 1, where said at least two links of said adjustment mechanism comprise cables that are oppositely wrapped about said rotary element.

4. The radiation collection apparatus of claim 2, where:

said rotary element is a cam element affixed to said support shaft for rotation therewith; and said at least two links of said adjustment mechanism comprise cables that are oppositely wrapped about said cam element.

5. The radiation collection apparatus of claim 2, further comprising:

a secondary reflector rotatably mounted on said movable arm for movement therewith to re-focus received radiation on said radiation receiving element; and a coupling between said support shaft and said secondary mirror that rotates said secondary mirror with respect to said movable arm in relation to the rotation of said support shaft.

6. The radiation collection apparatus of claim 2, where said mirror is trough-shaped and concentrates solar radiation along a first axis, and said apparatus further comprises:

a secondary mirror mounted on said movable arm for movement therewith to re-focus received radiation on said radiation receiving element, where said secondary mirror is trough-shaped and oriented to concentrate solar radiation along a second axis that is different than said first axis.

7. The radiation collection apparatus of claim 1, where said mirror support structure includes a crossbeam of variable stiffness for imparting a variable stiffness to said mirror.

8. The radiation collection apparatus of claim 7, where said crossbeam has a thickness that varies along a bent axis of said mirror.

9. The radiation collection apparatus of claim 1, where said mirror is in the shape of a trough.

10. The radiation collection apparatus of claim 1, where said mirror is in the shape of a dish.

11. The radiation collection apparatus of claim 1, where:

said mirror has a center and a pair of opposed endpoints;

said at least one point is located at a center of said mirror; and said adjustment mechanism is coupled to said mirror at said endpoints.

12. The radiation collection apparatus of claim 1, where:

said mirror has a center and a pair of opposed endpoints;

said mirror support structure holds said mirror fixed in a region about said center, while allowing flexure of non-central regions of said mirror; and said adjustment mechanism is coupled to said mirror at said endpoints.

13. The radiation collection apparatus of claim 1, where:

said mirror comprises two juxtaposed and independently supported mirror segments, each of the mirror segments having inboard and outboard ends, with the inboard ends of said mirror segments being disposed in juxtaposition;

said mirror support structure contacts said mirror segments to hold fixed the outboard ends of both mirror segments, while allowing flexure of other regions of said mirror segments; and said at least two links of said adjustment mechanism oppositely couple said rotary element to the inboard ends of said mirror segments to oppositely flex the inboard ends of said mirror segments in relation to the rotation of said rotary element.

14. The radiation collection apparatus of claim 1, where:

said mirror comprises two juxtaposed and independently supported mirror segments, each of the mirror segments having inboard and outboard ends, with the inboard ends of said mirror segments being disposed in juxtaposition;

said mirror support structure contacts said mirror segments to hold fixed central portions of both mirror segments, while allowing flexure of the other regions of said mirror segments; and said at least two links of said adjustment mechanism oppositely couple said rotary element to both the inboard ends and the outboard ends of said mirror segments.

15. A radiation collection apparatus comprising:

a stationary radiation focusing element having a fixed radius of curvature, and characterized in that solar radiation incident on the radiation focusing element is focused on a circular path of focus that intersects said radiation focusing element on at least one point;

a support structure contacting said radiation focusing element to hold said radiation focusing element fixed in a region about said at least one point, while allowing flexure of other regions of said radiation focusing element;

a radiation receiving element constrained to move relative to the radiation focusing element in said circular path of focus so that solar radiation incident on the radiation focusing element region held fixed by said support structure is naturally reflected and focused on said radiation receiving element; and an adjustment mechanism including a rotary element disposed above said radiation focusing element at a center of said circular path of focus constrained to rotate in relation to the movement of said radiation receiving element, and at least two links oppositely coupling said rotary element to said radiation focusing element at locations removed from said at least one point so as to oppositely flex the radiation focusing element at said removed locations in relation to the rotation of said rotary element to compensate for focusing errors.

16. The radiation collection apparatus of claim 14, wherein:

said at least two links of said adjustment mechanism oppositely couple said rotary element to the inboard ends of said mirror segments to oppositely flex the inboard ends of said mirror segments in relation to the rotation of said rotary element; and said at least two links of said adjustment mechanism oppositely couple said rotary element to the outboard ends of said mirror segments to oppositely flex the outboard ends of said mirror segments in relation to the rotation of said rotary element.

17. The radiation collection apparatus of claim 15, where said radiation focusing element is a mirror.

* * * * *